US008360559B2

(12) United States Patent
Miyazawa

(10) Patent No.: US 8,360,559 B2
(45) Date of Patent: Jan. 29, 2013

(54) LIQUID EJECTING HEAD, LIQUID EJECTING APPARATUS, AND PIEZOELECTRIC ELEMENT

(75) Inventor: Hiromu Miyazawa, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 90 days.

(21) Appl. No.: 13/102,534

(22) Filed: May 6, 2011

(65) Prior Publication Data

US 2011/0273519 A1 Nov. 10, 2011

(30) Foreign Application Priority Data

May 7, 2010 (JP) ................................ 2010-107742

(51) Int. Cl.

| | |
|---|---|
| ***B41J 2/045*** | (2006.01) |
| ***C04B 35/495*** | (2006.01) |
| ***C04B 35/00*** | (2006.01) |
| ***H01L 41/18*** | (2006.01) |
| ***H01L 41/187*** | (2006.01) |

(52) U.S. Cl. ............... 347/71; 252/62.9 R; 252/62.9 PZ

(58) Field of Classification Search .................... 347/68, 347/70–72; 252/62.9 R, 62.9 PZ
See application file for complete search history.

(56) References Cited

U.S. PATENT DOCUMENTS

2011/0221831 A1 * 9/2011 Yonemura et al. .............. 347/68

FOREIGN PATENT DOCUMENTS

JP 2001-223404 A 8/2001
SU 526605 A * 10/1976

* cited by examiner

*Primary Examiner* — Matthew Luu
*Assistant Examiner* — Lisa M Solomon
(74) *Attorney, Agent, or Firm* — Workman Nydegger

(57) ABSTRACT

A liquid ejecting head includes a pressure-generating chamber in fluid communication with a nozzle opening and a piezoelectric element having a piezoelectric layer and electrodes provided to the piezoelectric layer. The piezoelectric layer is composed of a complex oxide having a perovskite structure containing bismuth and cerium in the A site of the perovskite structure and at least one metallic element selected from the group consisting of iron, cobalt, and chromium in the B site of the perovskite structure, and the molar ratio of the metallic element or elements in the B site, the bismuth, and the cerium is 1:(1−x):(3x/4).

9 Claims, 10 Drawing Sheets

LIQUID EJECTING HEAD, LIQUID EJECTING APPARATUS, AND PIEZOELECTRIC ELEMENT

CROSS-REFERENCE TO RELATED APPLICATION

This application claims priority to Japanese Patent Application No: 2010-107742, filed on May 7, 2010, which is expressly incorporated by reference herein in its entirety.

BACKGROUND

Technical Field

Embodiments of the present invention relate to a liquid ejecting head including a piezoelectric element that causes a change in pressure in a pressure-generating chamber in fluid communication with a nozzle opening. The piezoelectric element has a piezoelectric layer and electrodes for applying a pressure to the piezoelectric layer. Embodiments of the present invention also relate to a liquid ejecting apparatus and a piezoelectric element.

Some piezoelectric actuators used in liquid ejecting heads use a piezoelectric element having a structure in which a piezoelectric layer made of a piezoelectric material, for example, a crystallized dielectric material, exhibiting an electromechanical conversion function is disposed between two electrodes. A typical example of the liquid ejecting head is an ink jet recording head in which a diaphragm forms part of a pressure-generating chamber in fluid communication with a nozzle opening for discharging ink droplets. A pressure is applied to the ink in the pressure-generating chamber by deforming the diaphragm with a piezoelectric element to discharge the ink as droplets from the nozzle opening.

The piezoelectric material used as the piezoelectric layer (piezoelectric ceramic) forming such a piezoelectric element should have a high piezoelectric property. Typical examples of such piezoelectric material include lead zirconate titanate (PZT) (see JP-A-2001-223404).

However, from the viewpoint of protecting the environment, there is a demand for a piezoelectric material having less lead content. As an example of a piezoelectric material not containing lead, Bi-based piezoelectric material having a perovskite structure with a general chemical formula expressed as $ABO_3$ is known, but the Bi-based piezoelectric material has low insulation and, therefore, can easily cause a leakage current. Accordingly, there is a problem that it is difficult to apply the material to liquid ejecting heads.

The foregoing issues and problems are not only of concern in ink jet recording heads, of course, but are also of concern in other liquid ejecting heads for discharging droplets other than ink. In addition, the foregoing issues and problems are of concern in piezoelectric elements that are used for devices other than liquid ejecting heads.

SUMMARY

In general, example embodiments of the invention relate to a liquid ejecting head, a liquid ejecting apparatus, and a piezoelectric element that have low environmental impact and in which leakage currents are prevented or reduced.

According to a first general aspect of the invention, a liquid ejecting head includes a pressure-generating chamber in fluid communication with a nozzle opening and a piezoelectric element having a piezoelectric layer and electrodes provided to the piezoelectric layer. The piezoelectric layer is composed of a complex oxide having a perovskite structure containing bismuth and cerium in the A site of the perovskite structure and at least one metallic element selected from the group consisting of iron, cobalt, and chromium in the B site of the perovskite structure. The molar ratio of the metallic element or elements in the B site, the bismuth, and the cerium is 1:(1−x):(3x/4).

In the foregoing liquid ejecting head, a leakage current can be prevented or reduced. In addition, since lead is not included in the piezoelectric element, a detrimental environmental impact can be reduced.

In another embodiment, the B site includes iron as the metallic element.

In another embodiment, the B site includes cobalt and chromium as the metallic elements.

The piezoelectric layer may have a monoclinic crystalline structure. The monoclinic crystalline structure exhibits a better piezoelectric property.

According to a second general aspect of the invention, a liquid ejecting apparatus includes the above-described liquid ejecting head.

In the foregoing liquid ejecting apparatus, the leakage current can be prevented or reduced. In addition, since lead is not included in the piezoelectric element, a detrimental environmental impact can be reduced.

According to a third general aspect of the invention, a piezoelectric element includes a piezoelectric layer and electrodes provided to the piezoelectric layer. The piezoelectric layer is composed of a complex oxide having a perovskite structure containing bismuth and cerium in the A site of the perovskite structure and at least one metallic element selected from the group consisting of iron, cobalt, and chromium in the B site of the perovskite structure. The molar ratio of the metallic element or elements in the B site, the bismuth, and the cerium is 1:(1−x):(3x/4).

In the foregoing piezoelectric element, the leakage current can be prevented or reduced. In addition, since lead is not included in the piezoelectric element, a detrimental environmental impact can be reduced.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

Aspects of example embodiments of the invention will become apparent from the description of the accompanying drawings, wherein like numbers reference like elements.

DESCRIPTION OF EXEMPLARY EMBODIMENTS

Figure 1:
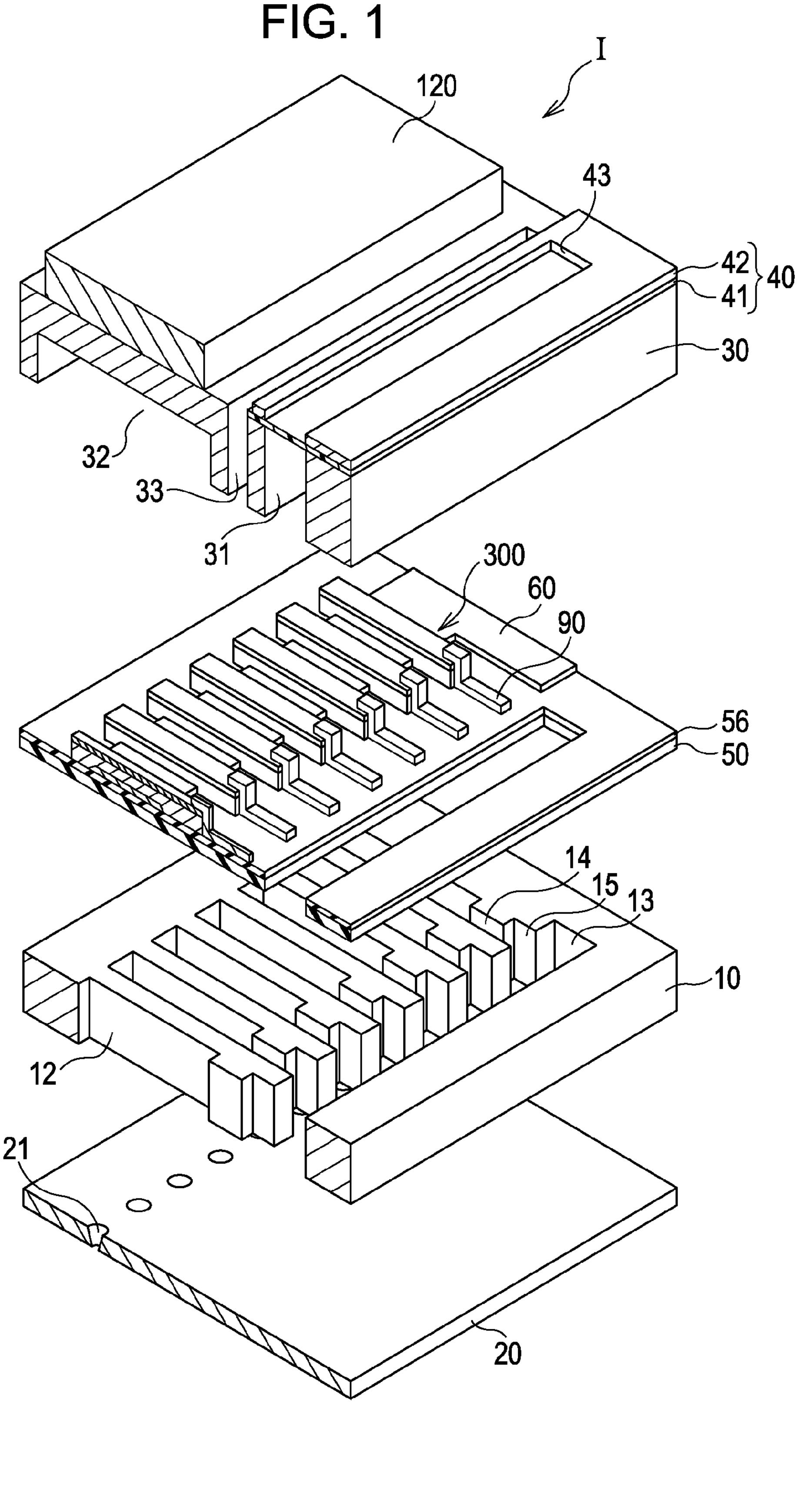
FIG. 1 is an exploded perspective view schematically illustrating components of a recording head according to a first embodiment.
Figure 2:
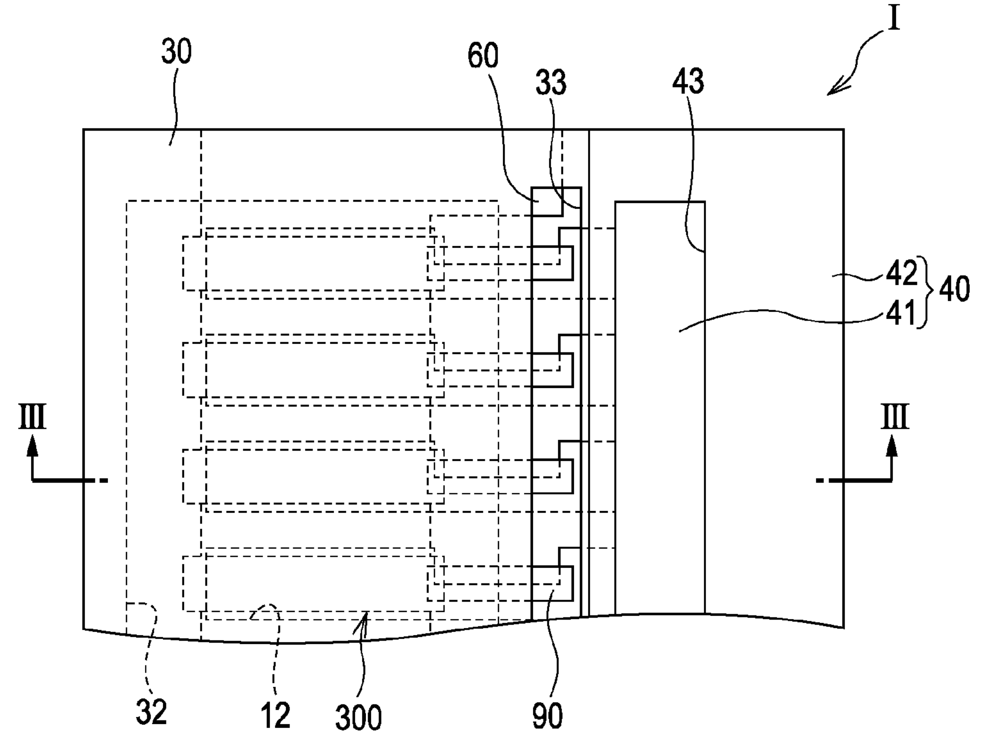
FIG. 2 is a plan view of the recording head according to the first embodiment.
Figure 3:
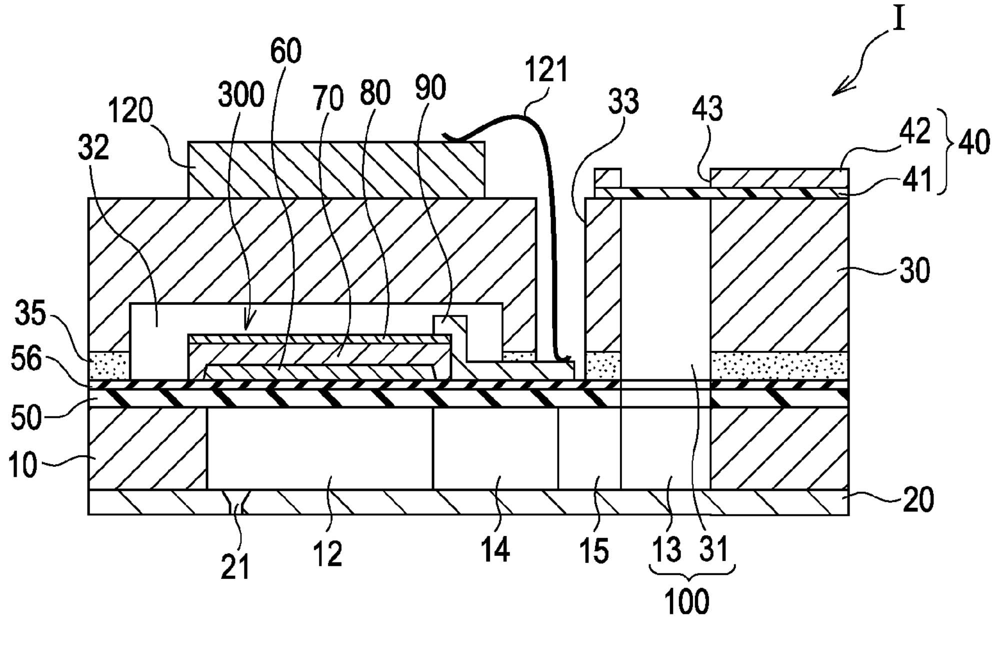
FIG. 3 is a cross-sectional view of the recording head according to the first embodiment.

FIG. 1 is an exploded perspective view schematically illustrating components of an ink jet recording head, which is an example of a liquid ejecting head according to one embodiment of the invention. FIG. 2 is a plan view of the recording head shown in FIG. 1, and FIG. 3 is a cross-sectional view taken along the line III-III of FIG. 2. As shown in FIGS. 1 to 3, a passage-forming substrate 10 of the ink jet recording head is a single-crystal silicon substrate, and an elastic film 50 of silicon dioxide is disposed on one surface thereof.

The passage-forming substrate 10 is provided with a plurality of pressure-generating chambers 12 arranged in parallel in their width direction. Furthermore, the passage-forming substrate 10 is provided with a communicating portion 13 in an area on an outer side in the longitudinal direction of the pressure-generating chambers 12, and the communicating portion 13 and each pressure-generating chamber 12 are in fluid communication with each other through an ink-supplying path 14 and a communicating path 15 provided for each of the pressure-generating chambers 12. The communicating portion 13 communicates with a manifold portion 31 of a protective substrate described below to form a part of the manifold serving as the ink chamber common to all the pressure-generating chambers 12. The ink-supplying path 14 has a width narrower than that of the pressure-generating chamber 12 and maintains a constant flow resistance against the ink flowing in the pressure-generating chamber 12 from the communicating portion 13. The ink-supplying path 14 may be formed by narrowing the width of a flow path on one side of the flow path, or may be formed by narrowing the width of the flow path on both sides of the flow path. Alternatively, the ink-supplying path may be formed by narrowing the flow path in the thickness direction, instead of narrowing the width of the flow path. In any case, the passage-forming substrate 10 is provided with a liquid passage including the pressure-generating chamber 12, the communicating portion 13, the ink-supplying path 14, and the communicating path 15.

In addition, the passage-forming substrate 10 is bonded to a nozzle plate 20 with, for example, an adhesive or a thermal adhesive film on an opened surface side opposite the side on which the elastic film 50 is disposed. The nozzle plate 20 is perforated with nozzle openings 21 that communicate with the corresponding pressure-generating chambers 12 in the vicinity of the ends of the pressure-generating chambers 12 on the side opposite to the ink-supplying path 14. The nozzle plate 20 may be made of, for example, a glass ceramic, a single-crystal silicon substrate, or stainless steel.

Furthermore, as described above, the elastic film 50 is disposed on the side of the passage-forming substrate 10 opposite the opened surface side. On the elastic film 50, an adhesive layer 56 made of, for example, titanium oxide is disposed to increase the adhesion of a first electrode 60 to a base such as the elastic film 50. Furthermore, an insulating film made of, for example, zirconium oxide, may be disposed between the elastic film 50 and the adhesive layer 56, as necessary.

On the adhesive layer 56, the first electrode 60, a piezoelectric layer 70 in the form of a thin film having a thickness of 2 μm or less (e.g., between 0.3 and 1.5 μm), and a second electrode 80 are laminated to form a plurality of piezoelectric elements 300. Thus, each of the piezoelectric elements 300 includes the first electrode 60, the piezoelectric layer 70, and the second electrode 80. In general, one of the electrodes of the piezoelectric elements 300 may be formed as a common electrode common to all pressure-generating chambers 12, and the other electrode and the piezoelectric layer 70 may be formed by individually patterning portions electrodes and piezoelectric layer portions specific to each pressure-generating chamber 12. Although the first electrode 60 may be formed as the common electrode of the piezoelectric elements 300 and the second electrode 80 is the individual electrode of each piezoelectric element 300, a reverse configuration may be implemented depending on an associated driving circuit or wiring. Furthermore, herein, the piezoelectric element 300 and a diaphragm, which is deformed by driving the piezoelectric element 300, are collectively referred to as an actuator. In the above-described example embodiment, the elastic film 50, the adhesive layer 56, the first electrode 60, and the insulating film optionally disposed between the elastic film 50 and the adhesive layer 56, function as the diaphragm. However, the diaphragm may be formed in other ways. For example, the elastic film 50 and the adhesive layer 56 may be omitted. Alternatively, the piezoelectric element 300 itself may substantially function as a diaphragm.

The piezoelectric layer 70 is made of a complex oxide having a perovskite structure including bismuth and cerium in the A site and at least one metallic element selected from the group consisting of iron, cobalt, and chromium in the B site.

The molar ratio of the metallic element or elements in the B site, the bismuth, and the cerium is 1:(1−x):(3x/4). By forming the piezoelectric layer 70 in this manner, a leakage current is prevented, as described below. In addition, since lead is not included in the piezoelectric layer 70, a detrimental environmental impact can be reduced.

Bismuth contained in the complex oxide tends to volatilize during the production process, in particular, during the calcination of the piezoelectric body, which undesirably tends to cause a crystal deficiency in the A site. As Bi is volatilized, oxygen is simultaneously lost to maintain a balance in the number of electrons. The presence of this oxygen defect itself narrows the band gap of the piezoelectric element, which directly causes generation of a leakage current. The oxygen defect can be avoided by avoiding the Bi defect. One method for avoiding the Bi defect is to add Bi in advance in an amount that exceeds that of the stoichiometric composition. However, excessive Bi enters not only the A site but also the B site at a certain ratio. The Bi entered in the B site serves as an electron supplier, which causes generation of leakage current in the piezoelectric element.

In one embodiment, by including certain amounts of bismuth and cerium in the A site, even if deficiency has occurred in the amount of bismuth, cerium enters the A site to maintain the insulation. That is, a decrease in insulation due to a deficiency of bismuth is prevented to make the piezoelectric layer 70 have a high insulating property. By doing so, a leakage current in the piezoelectric element 300 can be prevented. For example, the leakage current of the piezoelectric layer 70 when a voltage of 25 V is applied can be kept to be $1.0\times10^{-1}$ A/cm$^2$ or less, preferably $1.0\times10^{-3}$ A/cm$^2$ or less. Note that a voltage of 25 V is a typical drive voltage that is applied to each piezoelectric element of ink jet recording heads.

As described below with reference to FIGS. 4 to 6 in which bismuth ferrate ($BiFeO_3$) is used as an example complex oxide of the piezoelectric layer 70, the piezoelectric layer 70 has an excellent insulating property. Note that the following explanation will describe an insulating property by focusing on the A site of a complex oxide.

Figure 4:
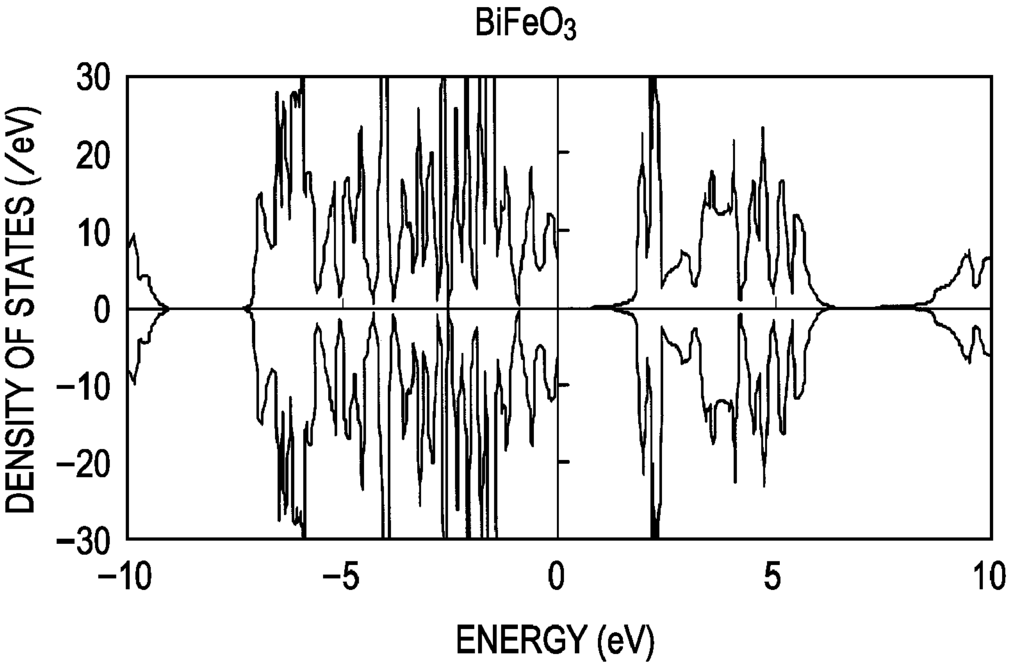
FIG. 4 is a graph showing the density of states of $BiFeO_3$ in a perfect crystalline state.
Figure 5:
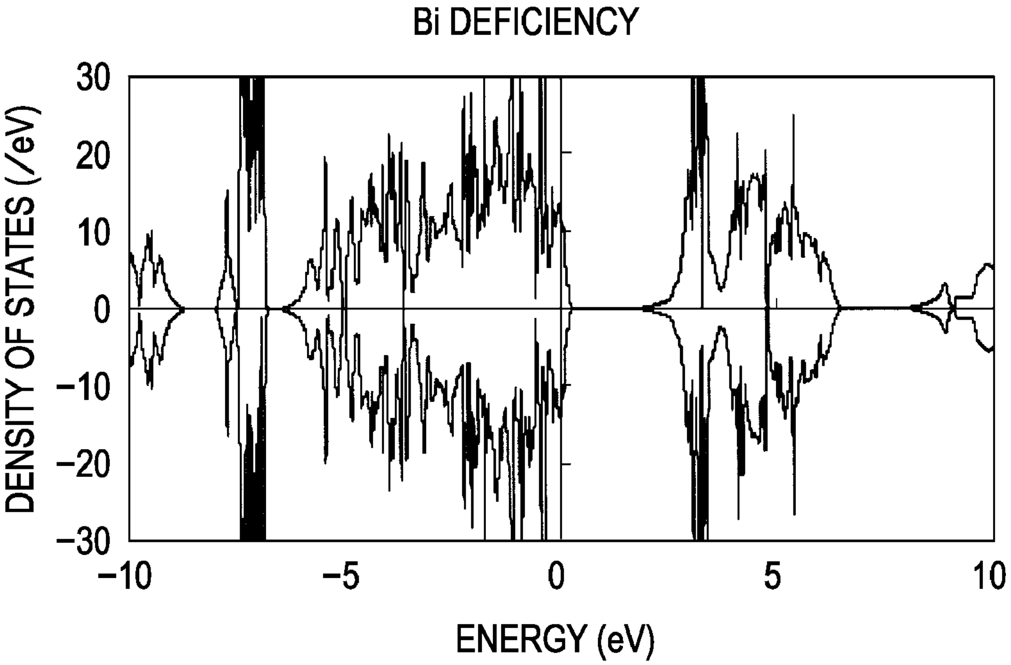
FIG. 5 is a graph showing the density of states when 12.5% of Bi in $BiFeO_3$ is volatilized.
Figure 6:
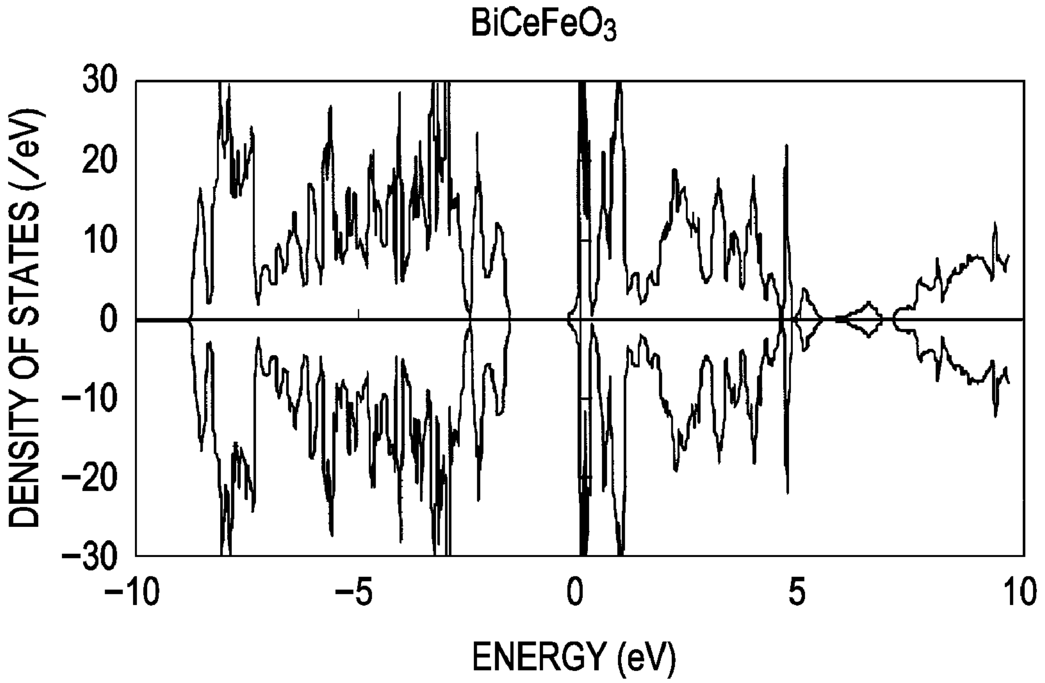
FIG. 6 is a graph showing the density of states when 12.5% of Bi in $BiFeO_3$ is replaced by Ce.

FIGS. 4 to 6 are graphs showing the density of states of each crystal determined by using first principle electronic state calculation. The horizontal axis shows the energy difference (eV) of electrons, and the vertical axis shows the density of states (DOS) of electrons. The plus side of the density of states (higher than 0/eV) shows the up-spin, and the minus side shows the down-spin. As the conditions for the first principle electronic state calculation, an ultra-soft pseudopotential based on a density functional method within the range of generalized gradient approximation (GGA) was used. For the transition metal atoms in the B site, in order to account for the strong correlation effect due to d-electron orbital localization, a GGA plus U method (GGA+U method) was used. The cut-off of the wave function and the cut-off of the charge density are respectively 20 hartree and 360 hartree. The super cell of the crystal used for the calculation is composed of 2×2×2(=8) $ABO_3$-type perovskite structures. The mesh of the reciprocal lattice point (k point) is (4×4×4). Furthermore, the position of each atom is optimized so that the force acting on the atoms is minimized. FIG. 4 is a graph showing the density of states of bismuth ferrate ($BiFeO_3$) in a perfect crystalline state, FIG. 5 is a graph showing the density of states when 12.5% of Bi in bismuth ferrate ($BiFeO_3$) was lost, and FIG. 6 is a diagram showing the density of states when 12.5% of Bi in bismuth ferrate ($BiFeO_3$) was replaced by Ce.

The antiferromagnetic states of all systems in the cases shown in FIGS. 4 to 6 were stable.

As shown in FIG. 4, when $BiFeO_3$ is a complete crystal, that is, when there are no holes in either site and no replacement of Bi by another element, the Fermi level is the top of the valence band to provide an insulating property. Incidentally, the Fermi level is defined as the highest energy level occupied by an electron in one-electron energy obtained by electronic-state simulation.

As shown in FIG. 5, it was confirmed that in $BiFeO_3$, when a deficiency is generated by causing loss of a portion of the bismuth (Bi), peaks project on the plus side of the 0 eV energy level, that is, the Fermi level is within the range of a valence band to cause loss of an insulating property and to generate holes to give a p-type material characteristic to the complex oxide. It was confirmed that the area of density of states of the valence band holes (the projection area of peaks in the plus side) obtained by integration is comparable to three electrons. This revealed that the bismuth in the crystal system of $BiFeO_3$ contributes as 3+.

Furthermore, as shown in FIG. 6, it was confirmed that when a portion of the bismuth (Bi) of $BiFeO_3$ is forcedly replaced by cerium, peaks project on the minus side of the 0 eV energy level, that is, the Fermi level is within the range of a conduction band to cause loss of an insulating property and to give an n-type material characteristic to the complex oxide. It was confirmed that the area of density of states of the conduction electrons (the projection area of peaks in the minus side) obtained by integration is comparable to one electron. It was confirmed from FIGS. 4 to 6 that cerium contribute as 4+ and functions as an n-type donor.

From the above, it was confirmed that a high insulating property can be maintained by including bismuth and cerium in the A site of the perovskite structure, that is, by replacing a portion of the bismuth with cerium. More specifically, it was confirmed that cerium performs charge compensation for a crystal deficiency of bismuth to maintain an insulating property. Furthermore, in the above-described example, the insulating property has been described by using $BiFeO_3$ and focusing on the A site, but the behavior, such as the position of the Fermi level, is the same even if the B site material is cobalt; chromium; cobalt and chromium; or iron, cobalt, and chromium.

When the deficiency amount of bismuth is represented by x and the addition amount of cerium is represented by y, the A site material can be expressed by $Bi_{1-x}Ce_y$. As proved based on the above-described first principle calculation, bismuth functions as a trivalent material, and cerium functions as a tetravalent material. The charge neutrality of the crystal can be maintained by keeping the A site trivalent in total. Therefore, the composition balance of Bi and Ce may satisfy $3(1-x)+4y=3$. That is, when the deficiency amount of Bi is x, cerium may be contained in an amount of 3x/4. Therefore, for example, a complex oxide in which the molar ratio of the metallic element or elements in the B site, the bismuth, and the cerium is 1:(1−x):(3x/4) can be obtained by adding Ce in an amount of 3x/4 for the estimated deficiency amount x of Bi during the production process. Under such conditions, even if the number of electrons is decreased by a deficiency of Bi, the excessive electrons possessed by added cerium compensate for the decrease to hardly cause an oxygen defect. Based on experimentation, an acceptable molar ratio of cerium in the complex oxide to the total of bismuth and cerium is between 0.01 and 0.13. Consequently, the piezoelectric layer 70 can have a higher insulating property and less leakage current compared to a complex oxide of a piezoelectric layer not including Ce.

The complex oxide includes, in the B site, at least one metallic element selected from the group consisting of iron (Fe), cobalt (Co), and chromium (Cr). Specifically, examples of the B-site material include iron; cobalt; chromium; cobalt and chromium; and iron, cobalt, and chromium.

When the B site includes cobalt and chromium, the molar ratio of cobalt to the total of chromium and cobalt may be between 0.125 and 0.875. A complex oxide forming the piezoelectric layer 70 that includes cobalt and chromium, which have different atomic radii from each other, in the B site position, include the cobalt and chromium at a certain ratio, and, thereby, the desired insulating property and magnetic property can be maintained. In addition, since such a complex oxide has a morphotropic phase boundary (MPB), the piezoelectric layer 70 can have an excellent piezoelectric property. In particular, when the molar ratio of chromium to the total of cobalt and chromium may be approximately 0.5, for example, the piezoelectric constant is increased to provide a particularly excellent piezoelectric property.

Furthermore, the piezoelectric layer 70 of the embodiment may have a monoclinic crystalline structure. That is, the piezoelectric layer 70 made of a complex oxide having a perovskite structure may have monoclinic symmetry. Such a piezoelectric layer 70 can have a high piezoelectric property. In such a structure, the polarization moment of the piezoelectric layer appears to easily rotate due to an electric field applied in a direction perpendicular to a plane. In the piezoelectric layer, the amount of a change in the polarization moment and the amount of a change in the crystal structure are directly linked to each other to exactly provide a piezoelectric property. From the above, in a structure in which a change in the polarization moment tends to occur, a high piezoelectric property can be obtained.

In addition, the B site may further contain a small amount of manganese. The amount of manganese contained in the B site is not limited, but, for example, when the B site is composed of iron and manganese, an acceptable molar ratio of manganese to the total of iron and manganese is between 0.01 and 0.09.

The piezoelectric layer 70 may be in an engineered domain arrangement in which the polarization direction is tilted at a certain angle (e.g., 50 to 60 degrees) with respect to the vertical direction of the film plane (the thickness direction of the piezoelectric layer 70).

Each second electrode 80, which is the individual electrode of the piezoelectric element 300, may be connected to a lead electrode 90 made of, for example, gold (Au) that is drawn out from the vicinity of the end on the ink-supplying path 14 side and extends on the adhesive layer 56.

Above the passage-forming substrate 10 provided with such piezoelectric elements 300, that is, above the first electrode 60, the adhesive layer 56, and the lead electrodes 90, a protective substrate 30 having the manifold portion 31 forming at least a part of a manifold 100 is bonded with an adhesive 35. The manifold portion 31 may be formed along the width direction of the pressure-generating chambers 12 so as to pass through the protective substrate 30 in the thickness direction and fluidly communicate with the communicating portion 13 of the passage-forming substrate 10 to form the manifold 100 serving as a common ink chamber for the pressure-generating chambers 12. Alternatively, the communicating portion 13 of the passage-forming substrate 10 may be divided so as to correspond to each pressure-generating chamber 12, and only the manifold portion 31 may serve as the manifold. Furthermore, for example, the passage-forming substrate 10 may include only the pressure-generating chambers 12, and members (for example, the elastic film 50 and the adhesive layer 56) interposed between the passage-forming substrate 10 and the protective substrate 30 may include the ink-supplying paths 14 that fluidly communicate with the manifold 100 and the corresponding pressure-generating chambers 12.

The protective substrate 30 may include a piezoelectric element holding portion 32, at an area facing the piezoelectric elements 300. The piezoelectric element holding portion 32 may provide a space that is enough not to hinder the movement of the piezoelectric elements 300. The space of the piezoelectric element holding portion 32 may or may not be sealed as long as it is large enough not to hinder the movement of the piezoelectric elements 300.

The protective substrate 30 may be made of a material having almost the same coefficient of thermal expansion as that of the passage-forming substrate 10. For example, the protective substrate 30 may be made of a glass or ceramic material. The protective substrate 30 may be a single-crystal silicon substrate formed of the same material as that of the passage-forming substrate 10.

The protective substrate 30 is provided with a through-hole 33 passing through the protective substrate 30 in the thickness direction. The through-hole 33 is formed so that the vicinity of the end of the lead electrode 90 extending from each piezoelectric element 300 is exposed by the through-hole 33.

Furthermore, a driving circuit 120 for driving the piezoelectric elements 300 arranged in parallel is fixed on the protective substrate 30. The driving circuit 120 may be, for example, a circuit board or a semiconductor integrated circuit (IC). The driving circuit 120 and the lead electrodes 90 are electrically connected to each other by a connecting wire 121 made of conductive wire, such as bonding wire.

In addition, a compliance substrate 40 composed of a sealing film 41 and a fixing plate 42 is bonded on the protective substrate 30. The sealing film 41 may be formed of a flexible material having a low rigidity and seals one side of the manifold portion 31. The fixing plate 42 is formed of a relatively hard material. The fixing plate 42 is provided with an opening 43 by completely removing the fixing plate 42 at the area facing the manifold 100 in the thickness direction. Therefore, the one side of the manifold 100 is sealed with only the flexible sealing film 41.

In such an ink jet recoding head, ink is fed through an ink inlet connected to exterior ink supplying means (not shown) to fill the inside from the manifold 100 to the nozzle openings 21 with ink. Then, a voltage is applied between the first electrode 60 and the second electrode 80 corresponding to each pressure-generating chamber 12 according to a recording signal from the driving circuit 120 to flexurally deform the elastic film 50, the adhesive layer 56, the first electrode 60, and the piezoelectric layer 70. Thereby, the pressure in each pressure-generating chamber 12 is increased, and ink droplets are discharged from the nozzle opening 21.

An example process of producing the piezoelectric element of the ink jet recording head according to an example embodiment will now be described with reference to FIGS. 7A, 7B, 8A to 8C, 9A, 9B, 10A to 10C, 11A, and 11B.

Figure 7A:
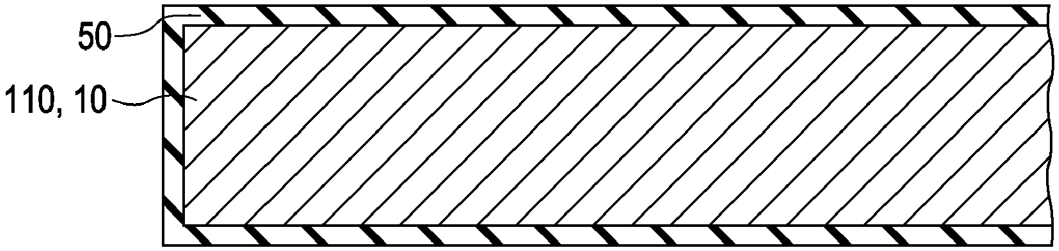
FIG. 7A is a first cross-sectional view of a recording head in its production process according to the first embodiment.
Figure 7B:
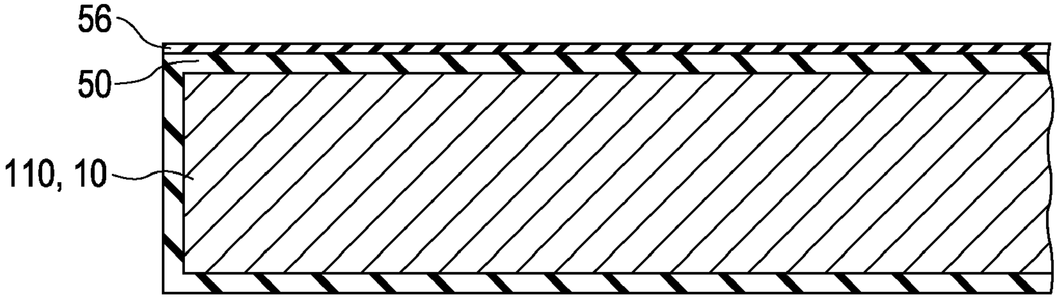
FIG. 7B is a second cross-sectional view of the recording head in its production process according to the first embodiment.

First, as shown in FIG. 7A, a silicon dioxide film of, for example, silicon dioxide ($SiO_2$), forming the elastic film 50 is formed on the surface of a silicon wafer as the passage-forming substrate wafer 110 by, for example, thermal oxidization. Then, as shown in FIG. 7B, an adhesive layer 56 of, for example, titanium oxide is formed on the elastic film 50 (silicon dioxide film) by, for example, reactive sputtering or thermal oxidation.

Figure 8A:
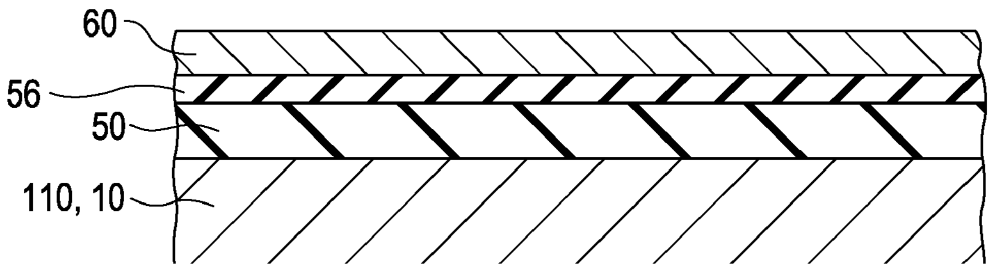
FIG. 8A is a third cross-sectional view of the recording head in its production process according to the first embodiment.

Then, as shown in FIG. 8A, a first electrode 60 is formed on the adhesive layer 56. Specifically, a first electrode 60 made of platinum, iridium, iridium oxide, or a layered structure thereof is formed on the adhesive layer 56. The adhesive layer 56 and the first electrode 60 can be formed by, for example, sputtering or vapor deposition.

Then, a piezoelectric layer 70 is laminated on the first electrode 60. The process of producing the piezoelectric layer 70 is not particularly limited, but, for example, the piezoelectric layer 70 can be formed by a metal-organic decomposition (MOD) method, in which a piezoelectric layer 70 of a metal oxide is produced by dissolving/dispersing an organometallic compound in a solvent and applying and drying the solution and firing it at high temperature, or by chemical solution deposition such as a sol-gel method. The piezoelectric layer 70 may be formed by another method, such as a laser ablation method, a sputtering method, a pulse laser deposition method (PLD method), a CVD method, or an aerosol deposition method.

Figure 8B:
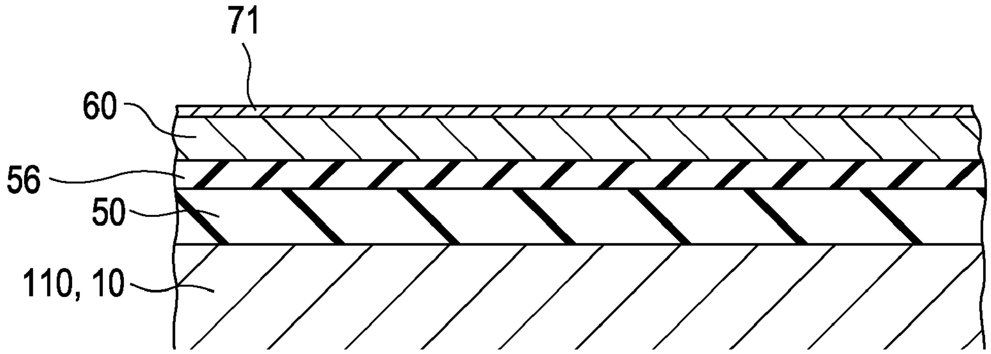
FIG. 8B is a fourth cross-sectional view of the recording head in its production process according to the first embodiment.

In a specific example of the procedure for forming the piezoelectric layer 70, first, as shown in FIG. 8B, on the first electrode 60, a sol or an MOD solution (precursor solution) containing organometallic compounds, specifically, organometallic compounds containing Bi, Ce, and at least one metallic element selected from the group consisting of Fe, Co, and Cr at a ratio that will produce a target composition ratio is applied by, for example, spin coating to form a piezoelectric precursor film 71 (application step).

The precursor solution to be applied is prepared by mixing organometallic compounds that can form a complex oxide containing Bi, Ce, and at least one metallic element selected from the group consisting of Fe, Co, and Cr at desired molar ratios and dissolving or dispersing the mixture in an organic solvent such as alcohol. At this stage, the extra amount of cerium is adjusted to an amount of 3x/4 for the estimated deficiency amount x of Bi.

Herein, the phrase "organometallic compounds that can form a complex oxide containing Bi, Ce, and at least one metallic element selected from the group consisting of Fe, Co, and Cr" refers to a mixture of organometallic compounds each containing at least one metal selected from the group consisting of Bi, Ce, and at least one metal selected from the group consisting of Fe, Co, and Cr. As the organometallic compounds respectively containing Bi, Ce, Fe, Co, and Cr, for example, metal alkoxides, organic acid salts, and β-diketone complexes can be used. Examples of the organometallic compound containing Bi include bismuth 2-ethylhexanoate. Examples of the organometallic compound containing Ce include cerium 2-ethylhexanoate. Examples of the organometallic compound containing Fe include iron 2-ethylhexanoate. Examples of the organometallic compound containing Co include cobalt 2-ethylhexanoate. Examples of the organometallic compound containing Cr include chromium 2-ethylhexanoate. An organometallic compound containing two or more of Bi, Ce, Fe, Co, and Cr may be used.

Then, the piezoelectric precursor film 71 is heated at a predetermined temperature for a predetermined time for drying (drying step). Subsequently, the dried piezoelectric precursor film 71 is heated to a predetermined temperature and is kept at the temperature for a predetermined period of time for degreasing (degreasing step). Herein, the term "degreasing" means that organic components contained in the piezoelectric precursor film 71 are eliminated as, for example, $NO_2$, $CO_2$, or $H_2O$. The atmospheres for the drying step and the degreasing step are not limited, and these steps may be performed in the air or in an inert gas.

Figure 8C:
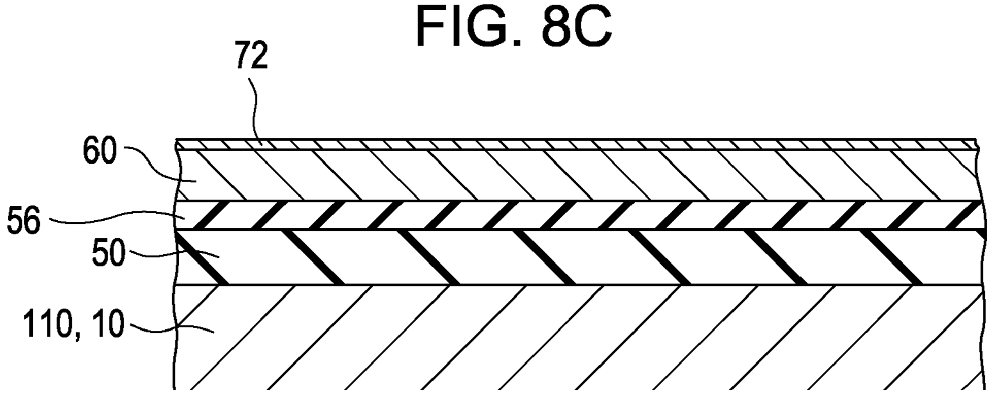
FIG. 8C is a fifth cross-sectional view of the recording head in its production process according to the first embodiment.

Then, as shown in FIG. 8C, the piezoelectric precursor film 71 is heated to a predetermined temperature, for example, about 600 to 800° C., and is kept at the temperature for a predetermined period of time for crystallization to form a piezoelectric film 72 (firing step). The atmosphere for the firing step is also not limited, and the step may be performed in the air or in an inert gas.

As the heating apparatus used in the drying step, the degreasing step, or the firing step, for example, a rapid thermal annealing (RTA) apparatus performing heating by irradiation with an infrared lamp or a hot plate can be used.

Figure 9A:
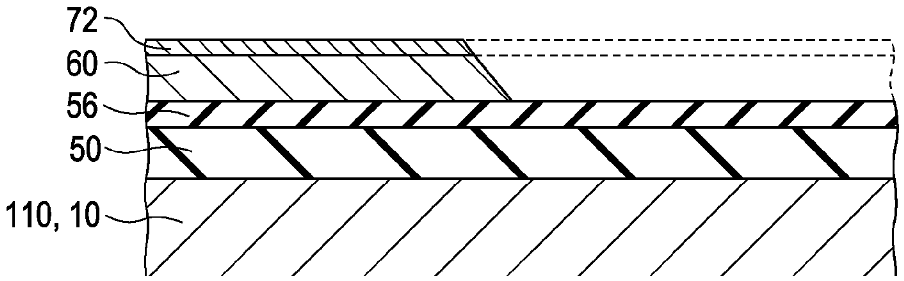
FIG. 9A is a sixth cross-sectional view of the recording head in its production process according to the first embodiment.

Then, as shown in FIG. 9A, the first electrode 60 and the first layer of the piezoelectric film 72 are simultaneously patterned so as to have an incline at their side faces using a resist (not shown) having a predetermined shape as a mask on the piezoelectric film 72.

Figure 9B:
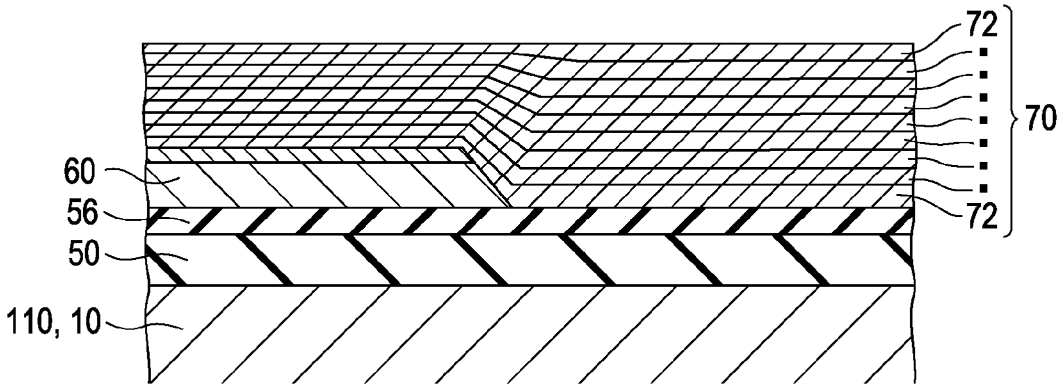
FIG. 9B is a seventh cross-sectional view of the recording head in its production process according to the first embodiment.

Then, after removal of the resist, a piezoelectric layer 70 composed of a plurality of the piezoelectric films 72, as shown in FIG. 9B, and having a predetermined thickness is formed by repeating more than once the application step, the drying step, and the degreasing step, or the application step, the drying step, the degreasing step, and the firing step, according to a desired thickness, etc. For example, when the thickness of each application of a solution is about 0.1 μm, the total thickness of the piezoelectric layer 70 composed of, for example, ten layers of the piezoelectric films 72 is about 1.1 μm. In this embodiment, the piezoelectric layer 70 is a laminated layer of the piezoelectric films 72, but may be a single layer.

Figure 10A:
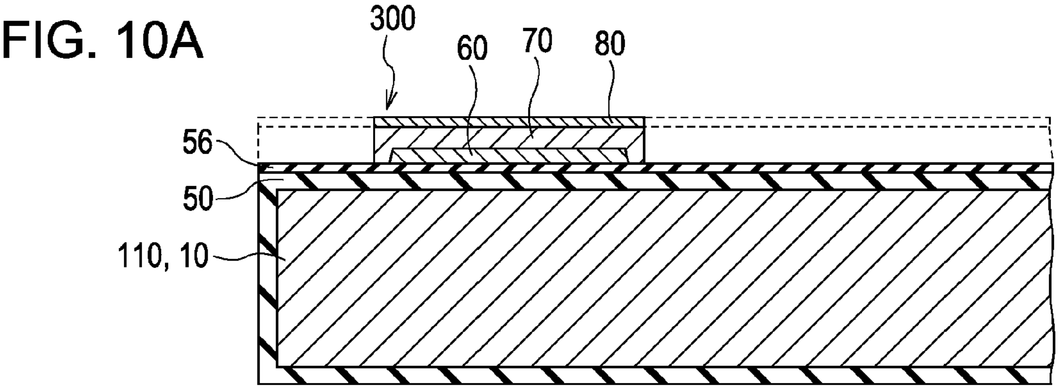
FIG. 10A is an eighth cross-sectional view of the recording head in its production process according to the first embodiment.

After thus forming the piezoelectric layer 70, as shown in FIG. 10A, a second electrode 80 of, for example, platinum is formed on the piezoelectric layer 70 by sputtering. Subsequently, the piezoelectric layer 70 and the second electrode 80 are simultaneously patterned in areas corresponding to the pressure-generating chambers 12 to form piezoelectric elements 300 each composed of the first electrode 60, the piezoelectric layer 70, and the second electrode 80. The patterning of the piezoelectric layer 70 and the second electrode 80 can be performed simultaneously by dry etching through a resist (not shown) having a predetermined shape. Then, as necessary, post annealing may be performed in a temperature range of 600 to 800° C. By doing so, the interface between the piezoelectric layer 70 and the first electrode 60 or the second electrode 80 can be improved, and also the crystallinity of the piezoelectric layer 70 can be improved.

Figure 10B:
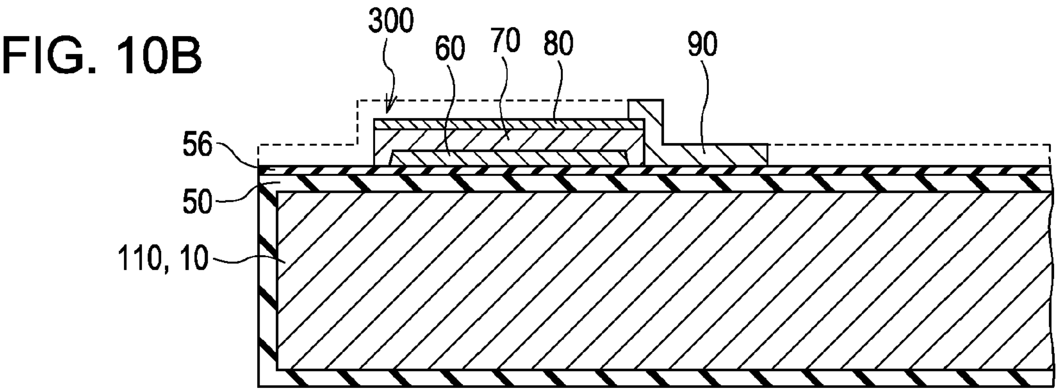
FIG. 10B is a ninth cross-sectional view of the recording head in its production process according to the first embodiment.

Then, as shown in FIG. 10B, a lead electrode 90 of, for example, gold (Au) is formed on the entire surface of the passage-forming substrate wafer 110 and then is patterned through a mask pattern (not shown) of a resist or the like to form the lead electrodes 90 corresponding to the respective piezoelectric elements 300.

Figure 10C:
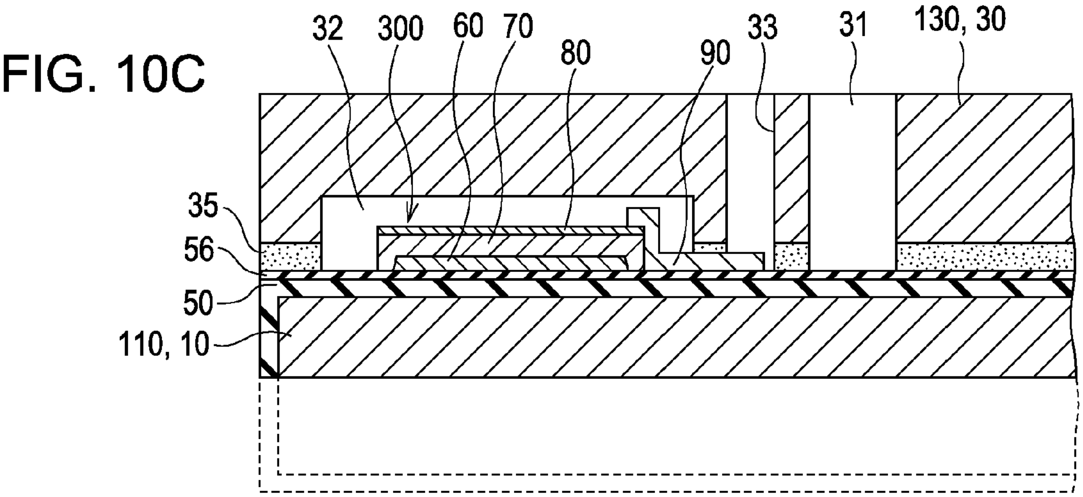
FIG. 10C is a tenth cross-sectional view of the recording head in its production process according to the first embodiment.

Then, as shown in FIG. 10C, a protective substrate wafer 130 that is a silicon wafer for forming a plurality of protective substrates 30 is bonded to the passage-forming substrate wafer 110 on the piezoelectric elements 300 side with an adhesive 35, and, subsequently, the passage-forming substrate wafer 110 is thinned to a predetermined thickness.

Figure 11A:
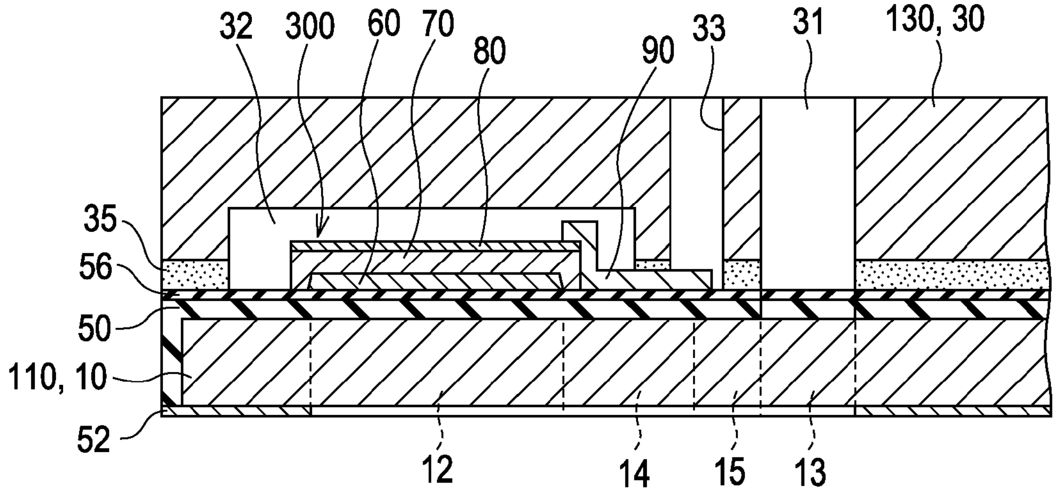
FIG. 11A is an eleventh cross-sectional view of the recording head in its production process according to the first embodiment.

Subsequently, as shown in FIG. 11A, a new mask film 52 is formed on the passage-forming substrate wafer 110 and patterned into a predetermined shape.

Figure 11B:
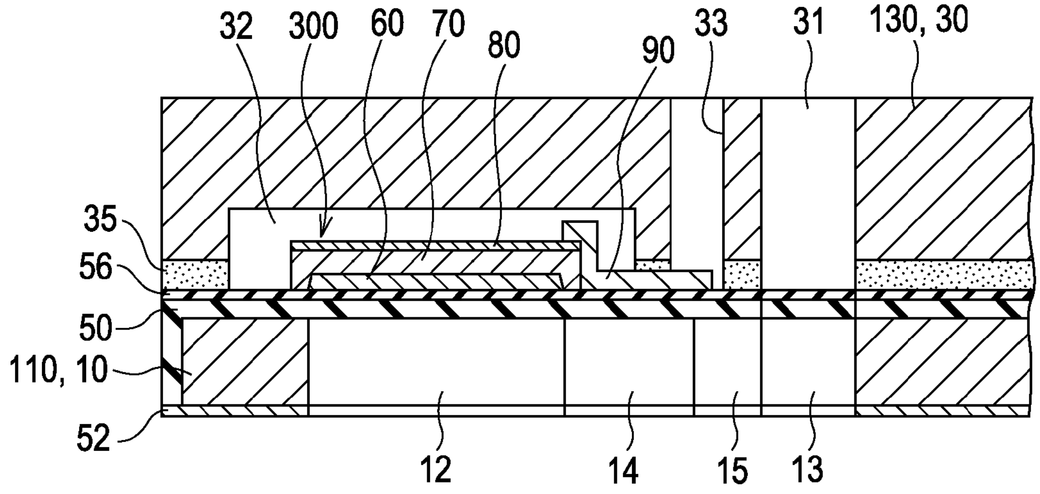
FIG. 11B is a twelfth cross-sectional view of the recording head in its production process according to the first embodiment.

Then, as shown in FIG. 11B, the passage-forming substrate wafer 110 is anisotropically etched (wet-etched) using an alkaline solution, such as KOH, through the mask film 52 to form the pressure-generating chambers 12, the communicating portion 13, the ink-supplying paths 14, and the communicating paths 15 corresponding to the piezoelectric elements 300.

Then, unneeded portions at the outer peripheral portions of the passage-forming substrate wafer 110 and the protective substrate wafer 130 are removed by cutting, e.g., by dicing. The mask film 52 on the opposite side of the passage-forming substrate wafer 110 from the protective substrate wafer 130 is removed. Subsequently, a nozzle plate 20 perforated with nozzle openings 21 is bonded to the passage-forming substrate wafer 110, and a compliance substrate 40 is bonded to the protective substrate wafer 130, and the passage-forming substrate wafer 110 and other associated components are divided into individual chip-sized passage-forming substrates 10 and other components as shown in FIG. 1 to produce an ink jet recording head.

Alternative Embodiments

An example embodiment according to an aspect of the invention has been described above, but the basic constitution of the invention is not limited thereto. For example, in the above-described embodiment, a single-crystal silicon substrate is used as the passage-forming substrate 10, but the passage-forming substrate 10 is not limited thereto and may be, for example, a SOI substrate or a glass substrate.

In addition, in the above-described embodiment, as an example, the piezoelectric elements 300 are formed by sequentially laminating a first electrode 60, a piezoelectric layer 70, and a second electrode 80 on a substrate (passage-forming substrate 10), but is not particularly limited thereto. The invention can be applied to, for example, a longitudinal vibration-type piezoelectric element that extends and contracts in the axial direction by alternately laminating a piezoelectric material and an electrode-forming material.

Figure 12:
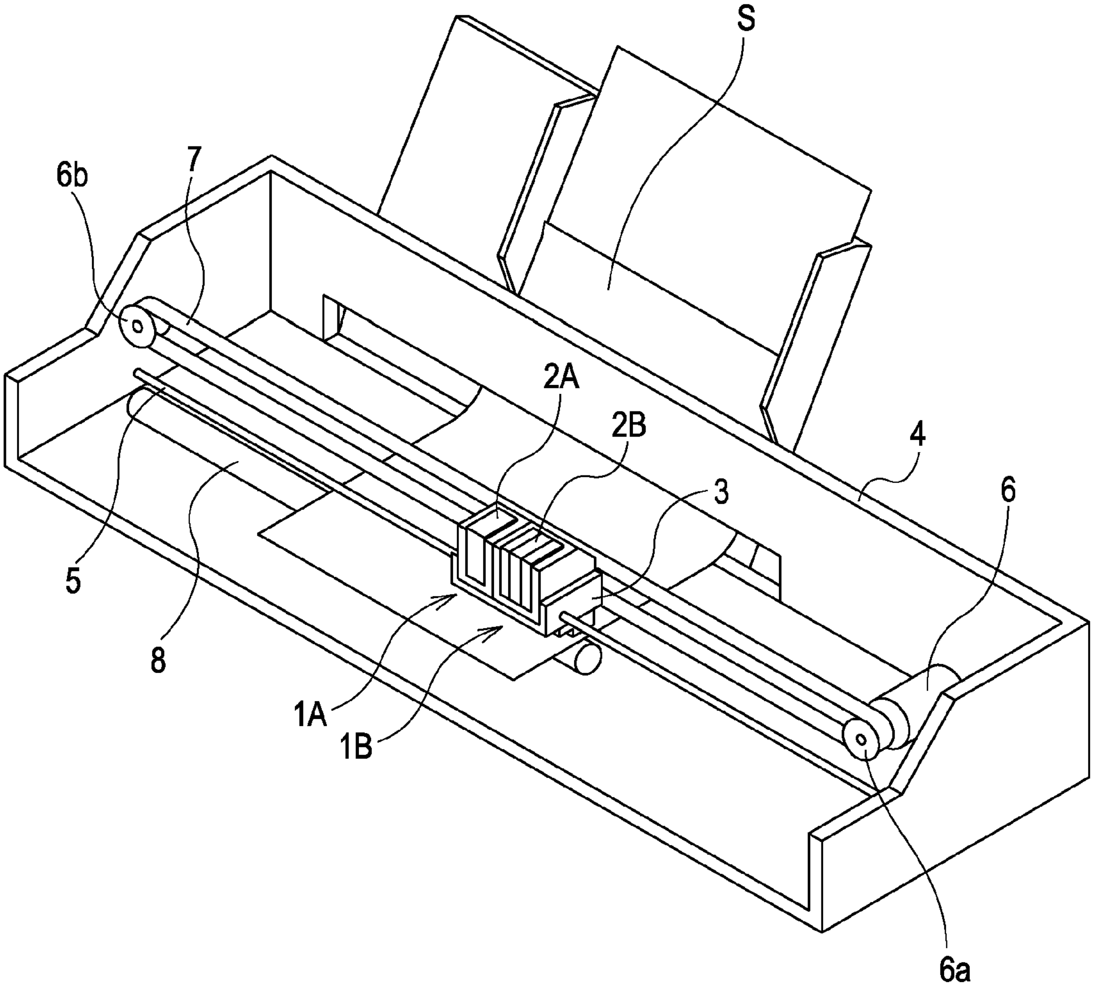
FIG. 12 is a view schematically showing components of a recoding apparatus according to an embodiment of the invention.

The ink jet recording head of the embodiment forms a part of a recording head unit including an ink flow path that fluidly communicates with, for example, an ink cartridge and is mounted on an ink jet recording apparatus. FIG. 12 is a schematic view showing an example of the ink jet recording apparatus.

As shown in FIG. 12, the recording head units 1A and 1B including the ink jet recording heads formed as described above are detachably provided with cartridges 2A and 2B serving as ink supplying means. A carriage 3 on which the recording head units 1A and 1B are mounted is positioned on a carriage axis 5, which is fixed to an apparatus body 4, such that the carriage 3 is movable in the axial direction. The recording head units 1A and 1B discharge, for example, a black ink composition and a color ink composition, respectively.

A driving force of a driving motor 6 is transferred to the carriage 3 through a plurality of gears (not shown) and a timing belt 7, and thereby the carriage 3, on which the recording head units 1A and 1B are mounted, is moved along the carriage axis 5. The apparatus body 4 is provided with a platen 8 along the carriage axis 5, and a recording sheet S, serving as a recording medium such as paper, is fed by, for example, a feeding roller (not shown) and is wrapped around the platen 8 and thereby transported.

In the example shown in FIG. 12, the ink jet recording head units 1A and 1B each have one ink jet recording head, but are not particularly limited thereto. For example, one ink jet recording head unit 1A or 1B may have two or more ink jet recording heads.

In the above-described embodiment, an ink jet recording head has been described as an example of the liquid ejecting head, but the invention broadly covers general liquid ejecting heads and can be applied to liquid ejecting heads that eject liquid other than ink. Examples of the other liquid ejecting heads include various types of recording heads used in image recording apparatuses such as printers, coloring material ejecting heads used for producing color filters of, for example, liquid crystal displays, electrode material ejecting heads used for forming electrodes of, for example, organic EL displays or field emission displays (FEDs), and bio-organic material ejecting heads used for producing bio-chips.

Since the piezoelectric element of the invention has a good insulating property and a good piezoelectric property, as described above, it can be applied to piezoelectric elements of liquid ejecting heads represented by ink jet recording heads, but application of the piezoelectric element is not limited thereto. For example, the piezoelectric element can be applied to piezoelectric elements of, for example, ultrasonic devices such as ultrasonic transmitters, ultrasonic motors, piezoelectric transformers, and various types of sensors such as infrared sensors, ultrasonic sensors, thermal sensors, pressure sensors, and pyroelectric sensors. In addition, the invention can be similarly applied to ferroelectric devices such as ferroelectric memories.

What is claimed is:

1. A liquid ejecting head comprising:

a pressure-generating chamber in fluid communication with a nozzle opening; and a piezoelectric element having a piezoelectric layer and electrodes provided to the piezoelectric layer, wherein the piezoelectric layer is includes a complex oxide having a perovskite structure including bismuth and cerium in the A site of the perovskite structure and at least one metallic element selected from the group consisting of iron, cobalt, and chromium in the B site of the perovskite structure, and wherein the molar ratio of the metallic element or elements in the B site, the bismuth, and the cerium is 1:(1−x):(3x/4).

2. The liquid ejecting head according to claim 1, wherein the B site includes iron as the metallic element.

3. The liquid ejecting head according to claim 1, wherein the B site includes cobalt and chromium as the metallic elements.

4. The liquid ejecting head according to claim 1, wherein the piezoelectric layer has a monoclinic crystalline structure.

5. A liquid ejecting apparatus comprising the liquid ejecting head according to claim 1.

6. A liquid ejecting apparatus comprising the liquid ejecting head according to claim 2.

7. A liquid ejecting apparatus comprising the liquid ejecting head according to claim 3.

8. A liquid ejecting apparatus comprising the liquid ejecting head according to claim 4.

9. A piezoelectric element comprising:

a piezoelectric layer and electrodes provided to the piezoelectric layer, wherein the piezoelectric layer is composed of a complex oxide having a perovskite structure including bismuth and cerium in the A site of the perovskite structure and at least one metallic element selected from the group consisting of iron, cobalt, and chromium in the B site of the perovskite structure, and wherein the molar ratio of the metallic element or elements in the B site, the bismuth, and the cerium is 1:(1−x):(3x/4).

* * * * *